United States Patent
Ning et al.

(10) Patent No.: US 8,058,120 B2
(45) Date of Patent: Nov. 15, 2011

(54) INTEGRATION SCHEME FOR STRAINED SOURCE/DRAIN CMOS USING OXIDE HARD MASK

(75) Inventors: Xian Jie Ning, Shanghai (CN); Bei Zhu, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 0 days.

(21) Appl. No.: 12/845,676

(22) Filed: Jul. 28, 2010

(65) Prior Publication Data
US 2011/0070701 A1   Mar. 24, 2011

(30) Foreign Application Priority Data
Sep. 18, 2009   (CN) .......................... 2009 1 0195981

(51) Int. Cl.
*H01L 21/8238* (2006.01)
*H01L 21/8234* (2006.01)
(52) U.S. Cl. ........................................ 438/199; 438/275
(58) Field of Classification Search .................. None
See application file for complete search history.

(56) References Cited

U.S. PATENT DOCUMENTS

| | | | |
|---|---|---|---|
| 5,168,072 | A | 12/1992 | Moslehi |
| 6,043,545 | A | 3/2000 | Tseng et al. |
| 6,121,100 | A | 9/2000 | Andideh et al. |
| 6,179,973 | B1 | 1/2001 | Lai et al. |
| 6,251,242 | B1 | 6/2001 | Fu et al. |
| 6,274,894 | B1 | 8/2001 | Wieczorek et al. |
| 6,277,249 | B1 | 8/2001 | Gopalraja et al. |
| 6,291,321 | B1 | 9/2001 | Fitzgerald |
| 6,352,629 | B1 | 3/2002 | Wang |
| 6,372,569 | B1 | 4/2002 | Lee et al. |
| 6,406,599 | B1 | 6/2002 | Subramani et al. |
| 6,406,973 | B1 | 6/2002 | Lee |
| 6,483,151 | B2 | 11/2002 | Wakabayashi et al. |

(Continued)

FOREIGN PATENT DOCUMENTS

CN   1499578 A   5/2004

(Continued)

OTHER PUBLICATIONS

Final Office Action for U.S. Appl. No. 12/234,393, mailed on Nov. 26, 2010, 10 pages.

(Continued)

*Primary Examiner* — Scott B Geyer
(74) *Attorney, Agent, or Firm* — Kilpatrick Townsend and Stockton LLP

(57) ABSTRACT

A method for forming a semiconductor integrated circuit device, e.g., CMOS, includes providing a semiconductor substrate having a first well region and a second well region. The method further includes forming a dielectric layer overlying the semiconductor substrate, the first well region and the second well region, and forming a polysilicon gate layer (e.g., doped polysilicon) overlying the dielectric layer. The polysilicon gate layer is overlying a first channel region in the first well region and a second channel region in the second well region. The method includes forming a hard mask (e.g., silicon dioxide) overlying the polysilicon gate layer and patterning the polysilicon gate layer and the hard mask layer to form a first gate structure including first edges in the first well region and a second gate structure including second edges in the second well region. Next, the method separately forms strained regions in the first and second well regions.

15 Claims, 10 Drawing Sheets

U.S. PATENT DOCUMENTS

| | | | |
|---|---|---|---|
| 6,503,773 | B2 | 1/2003 | Fitzgerald |
| 6,514,836 | B2 | 2/2003 | Belford |
| 6,563,152 | B2 | 5/2003 | Roberds et al. |
| 6,566,276 | B2 | 5/2003 | Maloney et al. |
| 6,617,623 | B2 | 9/2003 | Rhodes |
| 6,713,357 | B1 | 3/2004 | Wang et al. |
| 6,730,196 | B2 | 5/2004 | Wang et al. |
| 6,881,635 | B1 | 4/2005 | Chidambarrao et al. |
| 6,891,192 | B2 | 5/2005 | Chen et al. |
| 7,052,946 | B2 | 5/2006 | Chen et al. |
| 7,078,722 | B2 | 7/2006 | Anderson et al. |
| 7,195,985 | B2 | 3/2007 | Murthy et al. |
| 7,381,623 | B1 | 6/2008 | Chen et al. |
| 7,425,488 | B2 | 9/2008 | Wu et al. |
| 7,446,026 | B2 * | 11/2008 | Zhang et al. ............ 438/592 |
| 7,547,595 | B2 | 6/2009 | Ning |
| 7,557,000 | B2 | 7/2009 | Chen et al. |
| 7,709,336 | B2 | 5/2010 | Ning et al. |
| 7,820,500 | B2 | 10/2010 | Ning |
| 2002/0190284 | A1 | 12/2002 | Murthy et al. |
| 2003/0080361 | A1 | 5/2003 | Murthy et al. |
| 2003/0139001 | A1 | 7/2003 | Snyder et al. |
| 2004/0063300 | A1 | 4/2004 | Chi |
| 2005/0035409 | A1 | 2/2005 | Ko et al. |
| 2005/0142768 | A1 | 6/2005 | Lindert et al. |
| 2005/0158931 | A1 | 7/2005 | Chen et al. |
| 2005/0179066 | A1 | 8/2005 | Murthy et al. |
| 2006/0086987 | A1 | 4/2006 | Chen et al. |
| 2006/0105511 | A1 | 5/2006 | Yang et al. |
| 2006/0115949 | A1 | 6/2006 | Zhang et al. |
| 2006/0138398 | A1 | 6/2006 | Shimamune et al. |
| 2007/0072353 | A1 | 3/2007 | Wu et al. |
| 2007/0072376 | A1 | 3/2007 | Chen et al. |
| 2007/0128786 | A1 | 6/2007 | Cheng et al. |
| 2007/0138570 | A1 * | 6/2007 | Chong et al. ............ 257/371 |
| 2007/0184668 | A1 | 8/2007 | Ning et al. |
| 2007/0196992 | A1 | 8/2007 | Xiang et al. |
| 2008/0124874 | A1 | 5/2008 | Park et al. |
| 2008/0191244 | A1 * | 8/2008 | Kim et al. ............ 257/190 |
| 2008/0251851 | A1 * | 10/2008 | Pan et al. ............ 257/369 |
| 2008/0283926 | A1 * | 11/2008 | Sridhar ............ 257/369 |
| 2009/0023258 | A1 * | 1/2009 | Liang et al. ............ 438/222 |
| 2009/0065805 | A1 | 3/2009 | Wu et al. |
| 2009/0085125 | A1 * | 4/2009 | Kim et al. ............ 257/369 |
| 2009/0289379 | A1 * | 11/2009 | Han et al. ............ 257/E21.431 |
| 2010/0124818 | A1 * | 5/2010 | Lee et al. ............ 438/589 |
| 2010/0224937 | A1 * | 9/2010 | Sridhar ............ 257/369 |

FOREIGN PATENT DOCUMENTS

| | | |
|---|---|---|
| JP | 2006186240 A | 7/2007 |
| WO | WO 0154175 A1 | 7/2001 |
| WO | WO 2005038890 A1 | 4/2005 |

OTHER PUBLICATIONS

Final Office Action for U.S. Appl. No. 11/442,009, mailed on Nov. 19, 2010, 13 pages.
Non-Final Office Action for U.S. Appl. No. 11/442,009, mailed on Apr. 27, 2011, 11 pages.
Non-Final Office Action for U.S. Appl. No. 11/678,582 mailed on Apr. 6, 2011, 22 pages.
Non-Final Office Action for U.S. Appl. No. 11/244,955, mailed on Dec. 22, 2010, 9 pages.
Non-Final Office Action for U.S. Appl. No. 11/442,009, mailed on Jan. 5, 2009, 20 pages.
Final Office Action for U.S. Appl. No. 11/471,071, mailed on Jun. 24, 2008, 15 pages.
Final Office Action for U.S. Appl. No. 11/321,767, mailed on Aug. 29, 2008, 7 pages.
Final Office Action for U.S. Appl. No. 11/471,071, mailed on Jul. 14, 2009, 17 pages.
Final Office Action for U.S. Appl. No. 11/471,071, mailed on Mar. 2, 2010, 17 pages
Non-Final Office Action for U.S. Appl. No. 11/471,071, mailed on Jan. 3, 2008, 18 pages.
Non-Final Office Action for U.S. Appl. No. 11/321,767, mailed on Feb. 25, 2008, 6 pages.
Non-Final Office Action for U.S. Appl. No. 11/471,071, mailed on Nov. 3, 2008, 16 pages.
Non-Final Office Action for U.S. Appl. No. 11/321,767, mailed on Feb. 18, 2009, 8 pages.
Non-Final Office Action for U.S. Appl. No. 11/321,767, mailed on Aug. 31, 2009, 6 pages.
Non-Final Office Action for U.S. Appl. No. 11/471,071, mailed on Oct. 26, 2009, 18 pages.
Notice of Allowance for U.S. Appl. No. 11/321,767, mailed on Dec. 16, 2009, 3 pages.
Notice of Allowance for U.S. Appl. No. 11/471,071, mailed on Jun. 4, 2010, 3 pages.
Notice of Allowance for U.S. Appl. No. 11/471,071, mailed on Jul. 16, 2010, 7 pages.
Requirement for Restriction/Election for U.S. Appl. No. 11/321,767 mailed on Jul. 5, 2007, 5 pages.
Belford, et al., "Performance-Augmented CMOS Using Back-End Uniaxial Strain", 2002, Device Research Conference, Santa Barbara, California, pp. 1-2.
Comita, et al., "Low Temperature Si and SiGe Epitaxy for sub 01.µm Technology", 2003, Epi Technology Development Group Si Deposition Key Product Unit, Applied Materials, pp. 1-3.
Chuang, et al., "Design Considerations of SOI Digital CMOS VLSI", 1998,Proceedings 1998 IEEE International SOI Conference, pp. 5-8.
Final Office Action for U.S. Appl. No. 11/678,582, mailed on Oct. 30, 2009, 20 pages.
Final Office Action for U.S. Appl. No. 11/244,955, mailed on Mar. 26, 2010, 9 pages.
Final Office Action for for U.S. Appl. No. 11/678,582, mailed on Apr. 15, 2010, 21 pages.
GE, et al., "Process-strained Si (PSS) CMOS Technology Featuring 3D Strain Engineering," 2003, IEEE International Electron Devices Meeting, Washington, DC., pp. 1-4.
Notice of Allowance for U.S. Appl. No. 11/609,748, mailed on Jun. 24, 2009, 6 pages.
Non-Final Office Action for for U.S. Appl. No. 11/678,582, mailed on Apr. 28, 2009, 18 pages.
Non-Final Office Action for U.S. Appl. No. 11/244,955, mailed on Sep. 1, 2009, 9 pages.
Non-Final Office Action for U.S. Appl. No. 12/234,393, mailed on Jun. 10, 2010, 11 pages.
Non-Final Office Action for U.S. Appl. No. 11/442,009, mailed on Jul. 12, 2010, 13 pages.
Requirement for Restriction/Election for U.S. Appl. No. 11/244,955, mailed on Jul. 17, 2008, 5 pages.
Requirement for Restriction/Election for U.S. Appl. No. 11/678,582, mailed on Jul. 24, 2008, 3 pages.
Requirement for Restriction/Election for U.S. Appl. No. 11/244,955, mailed on Dec. 3, 2008, 5 pages.
Requirement for Restriction/Election for U.S. Appl. No. 11/244,955, mailed on Apr. 1, 2009, 3 pages.
Requirement for Restriction/Election for U.S. Appl. No. 12/234,393, mailed on Mar. 10, 2010, 7 pages.
Thompson, S.E., "Strained Silicon MOSFETs: The Next Material Change to Extend Moore's Law," 2004, Spring Material Research Society 2004, pp. 1-37.

* cited by examiner

INTEGRATION SCHEME FOR STRAINED SOURCE/DRAIN CMOS USING OXIDE HARD MASK

CROSS-REFERENCES TO RELATED APPLICATIONS

The present application claims priority to Chinese Patent Application No. 200910195981.9, filed on Sep. 18, 2009 by inventors Xian J. Ning and Bei Zhu, commonly assigned and incorporated in its entirety by reference herein for all purposes. The present application is also related to U.S. patent application Ser. No. 11/244,955 filed Oct. 5, 2005, U.S. patent application Ser. No. 12/234,393 filed Sep. 19, 2008, U.S. patent application Ser. No. 11/678,582 filed Feb. 24, 2007, U.S. patent application Ser. No. 11/442,009 filed May 26, 2006, U.S. patent application Ser. No. 11/609,748 filed Dec. 12, 2006, now U.S. Pat. No. 7,557,000. The disclosures of all the above applications are incorporated by reference in their entirety herein for all purposes.

BACKGROUND OF THE INVENTION

The present invention is directed to integrated circuits and their processing for the manufacture of semiconductor devices. More particularly, embodiments of the invention provide a method and structures for integrating PMOS and NMOS devices using strained silicon structures for advanced CMOS integrated circuit devices. But it would be recognized that the invention has a much broader range of applicability.

Integrated circuits have evolved from a handful of interconnected devices fabricated on a single chip of silicon to millions of devices. Conventional integrated circuits provide performance and complexity far beyond what was originally imagined. In order to achieve improvements in complexity and circuit density (i.e., the number of devices capable of being packed onto a given chip area), the size of the smallest device feature, also known as the device "geometry", has become smaller with each generation of integrated circuits.

Increasing circuit density has not only improved the complexity and performance of integrated circuits but has also provided lower cost parts to the consumer. An integrated circuit or chip fabrication facility can cost hundreds of millions, or even billions, of U.S. dollars. Each fabrication facility will have a certain throughput of wafers, and each wafer will have a certain number of integrated circuits on it. Therefore, by making the individual devices of an integrated circuit smaller, more devices may be fabricated on each wafer, thus increasing the output of the fabrication facility. Making devices smaller is very challenging, as each process used in integrated fabrication has a limit. That is to say, a given process typically only works down to a certain feature size, and then either the process or the device layout needs to be changed. Additionally, as devices require faster and faster designs, process limitations exist with certain conventional processes and materials.

An example of such a process is the manufacture of MOS devices itself Such device has traditionally became smaller and smaller and produced faster switching speeds. Although there have been significant improvements, such device designs still have many limitations. As merely an example, these designs must become smaller and smaller but still provide clear signals for switching, which become more difficult as the device becomes smaller. Additionally, these designs are often difficult to manufacture and generally require complex manufacturing processes and structures. These and other limitations will be described in further detail throughout the present specification and more particularly below.

From the above, it is seen that an improved technique for processing semiconductor devices is desired.

BRIEF SUMMARY OF THE INVENTION

According to the present invention, techniques for processing integrated circuits for the manufacture of semiconductor devices are provided. More particularly, the invention provides a method and structures for integrating PMOS and NMOS devices using strained silicon structures for advanced CMOS integrated circuit devices. But it would be recognized that the invention has a much broader range of applicability.

As further background information, integrated circuit processes generally involves gate patterning, which is normally using a poly crystalline silicon as a gate conductor. In the process, a polysilicon film is deposited on the substrate, which is a single crystal silicon that has undergone various processes such as implantations, gate oxide formation, among others. The polysilicon is then covered with one or more dielectric materials such as silicon oxide and/or silicon oxynitride. The dielectric film is then photo lithographically patterned and etched to form the gate conductor pattern. The patterned dielectric materials is then used as "hard mask" to transfer the pattern into polysilicon using a plasma etch process. The hard mask is stripped by wet chemicals after polysilicon patterning.

As critical dimension getting smaller, silicon germanium (e.g., SiGe) and silicon carbide (e.g., SiCx) as source and drains in a CMOS transistor provided for integrated circuits have been used by selective growth of epitaxal films in etched regions of the silicon substrate. Prior to the epitaxial film growth, a silicon etch is applied to for a recess in the silicon surface to form a site for silicon germanium to be deposited. The hard mask for polysilicon gate layer patterning mentioned above is used as a self-aligned mask for a recess etch of the silicon substrate. The hard mask is removed after epi growth in order to form silicide on top of patterned polysilcon gate structures. The dielectric hard mask removal process also undesirably erodes the polysilcon gate spacer (and possibly structure) that was formed after poly gate pattern as well as the shallow trench isolation (STI). Also, a polysilicon-gate, which is also doped by ion-implantation, is subjected to further degradation and other undesirable influences. This patent specification discloses an integration scheme that have SiGe and SiCx epi for PMOS and NMOS, respectively. The poly hard mask and spacer materials are designed to have reduced and/or minimum process steps as compared to conventional techniques. Further details of our method and structure can be found throughout the present specification and more particularly below.

In a specific embodiment, the present invention provides a method for forming a semiconductor integrated circuit device, e.g., CMOS. The method includes providing a semiconductor substrate (e.g., silicon wafer, silicon on insulator, epitaxial silicon) including a first well region and a second well region. In a specific embodiment, the method includes forming a dielectric layer (e.g., gate oxide, gate oxynitride, gate nitride) overlying the semiconductor substrate including the first well region and the second well region. In a specific embodiment, the method includes forming a polysilicon gate layer (e.g., doped polysilicon, in-situ polysilicon) overlying the dielectric layer. The polysilicon gate layer is overlying a first channel region in the first well region and a second channel region in the second well region in the semiconductor substrate. In a specific embodiment, the method includes forming a hard mask (e.g., silicon dioxide) overlying the polysilicon gate layer.

In a specific embodiment, the method patterns the polysilicon gate layer, including the hard mask layer, to form a first gate structure including first edges in the first well region and a second gate structure including second edges in the second well region. In a specific embodiment, the method forms a liner layer overlying the first gate structure and the second gate structure and overlying first source/drain regions in the first well region and second source/drain regions in the second well region. In a specific embodiment, the method includes forming a spacer dielectric layer overlying the liner layer. In a preferred embodiment, the spacer dielectric layer includes a first portion overlying the first gate structure and a second portion overlying the second gate structure.

Next, the method separately forms strained regions in the first and second well regions. In a specific embodiment, the method includes protecting the second gate structure, including second source/drain regions, and the second portion of the spacer dielectric layer provided in the second well region using a second photoresist mask material. The method includes patterning the first portion of the spacer dielectric layer to form first sidewall spacer structures on the first gate structure, including the first edges while the second photomasking material protects the second portion of the spacer dielectric layer and the second gate structure, including the second source/drain regions in the second well region. The method includes etching a first source region and a first drain region adjacent to the first gate structure using a first portion of the hard mask layer and the first sidewall spacers as a protective layer. The method includes depositing a silicon germanium fill material into the first source region and the first drain region to fill the etched first source region and the etched first drain region while causing the first channel region between the first source region and the first drain region to be strained in compressive mode from at least the silicon germanium material formed in the first source region and the first drain region. The second photoresist masking material is removed.

In a specific embodiment, the method protects the first gate structure, including first source/drain regions, and the first portion of the spacer dielectric layer provided in the first well region using a first photoresist mask material. The method includes patterning the second portion of the spacer dielectric layer to form second sidewall spacer structures on the second gate structure, including the second edges while the first photomasking material protects the first gate structure, including the first source/drain regions in the first well region. In a specific embodiment, the method includes etching a second source region and a second drain region adjacent to the second gate structure using a second portion of the hard mask layer and the second sidewall spacers as a protective layer. The method then deposits a silicon carbide fill material into the second source region and the second drain region to fill the etched second source region and the etched second drain region while causing the second channel region between the second source region and the second drain region to be strained in tensile mode from at least the silicon carbide material formed in the second source region and the second drain region. The first photoresist masking material is removed.

Depending upon the embodiment, one or more of these features may exist.

1. In a specific embodiment, the present method and structure can include a silicon dioxide and polysilicon hard mask for the present CMOS strained epi scheme.

2. In a preferred embodiment, transistors including PMOS and NMOS spacers are formed separately using two photo mask steps.

3. In a specific embodiment, the present method and structure can include an oxide nitride and/or nitride only as spacers for the present strained epi CMOS scheme.

4. In a specific embodiment, the present method and structure include an oxide hard mask for an NMOS silicon recess etch and epitaxial growth in the recessed region while the hard mask is used as a protecting layer. (Alternatively, if the process sequence is exchanged, the hard mask can also be for a PMOS recess etch and SiGe epitaxial growth in the recessed region).

5. In a specific embodiment, the method and structure include an oxide or like material in replacement of, for example, a polysilicon hard mask provided for an epitaxial recess etch and growth. In a preferred embodiment, removal of the oxide hard mask using a strip process does not attack spacers made of silicon nitride material.

Depending upon the embodiment, one or more of these features can exist. Of course, there can be other variations, modifications, and alternatives.

Many benefits are achieved by way of the present invention over conventional techniques. For example, the present technique provides an easy to use process that relies upon conventional technology. In some embodiments, the method provides higher device yields in dies per wafer. Additionally, the method provides a process that is compatible with conventional process technology without substantial modifications to conventional equipment and processes. Preferably, the invention provides for an improved process integration for design rules of 90 nanometers and less and/or 65 nanometers and less. Additionally, the invention provides for increased mobility of holes using a strained silicon structure for CMOS devices. In a preferred embodiment, the present invention provides an improved integration scheme for CMOS devices according to an embodiment of the present invention. Depending upon the embodiment, one or more of these benefits may be achieved. These and other benefits will be described in more throughout the present specification and more particularly below.

Various additional features and advantages of the present invention can be more fully appreciated with reference to the detailed description and accompanying drawings that follow.

DETAILED DESCRIPTION OF THE INVENTION

According to the present invention, techniques for processing integrated circuits for the manufacture of semiconductor devices are provided. More particularly, the invention provides a method and structures for integrating PMOS and NMOS devices using strained silicon structures for advanced CMOS integrated circuit devices. But it would be recognized that the invention has a much broader range of applicability.

Figure 1:
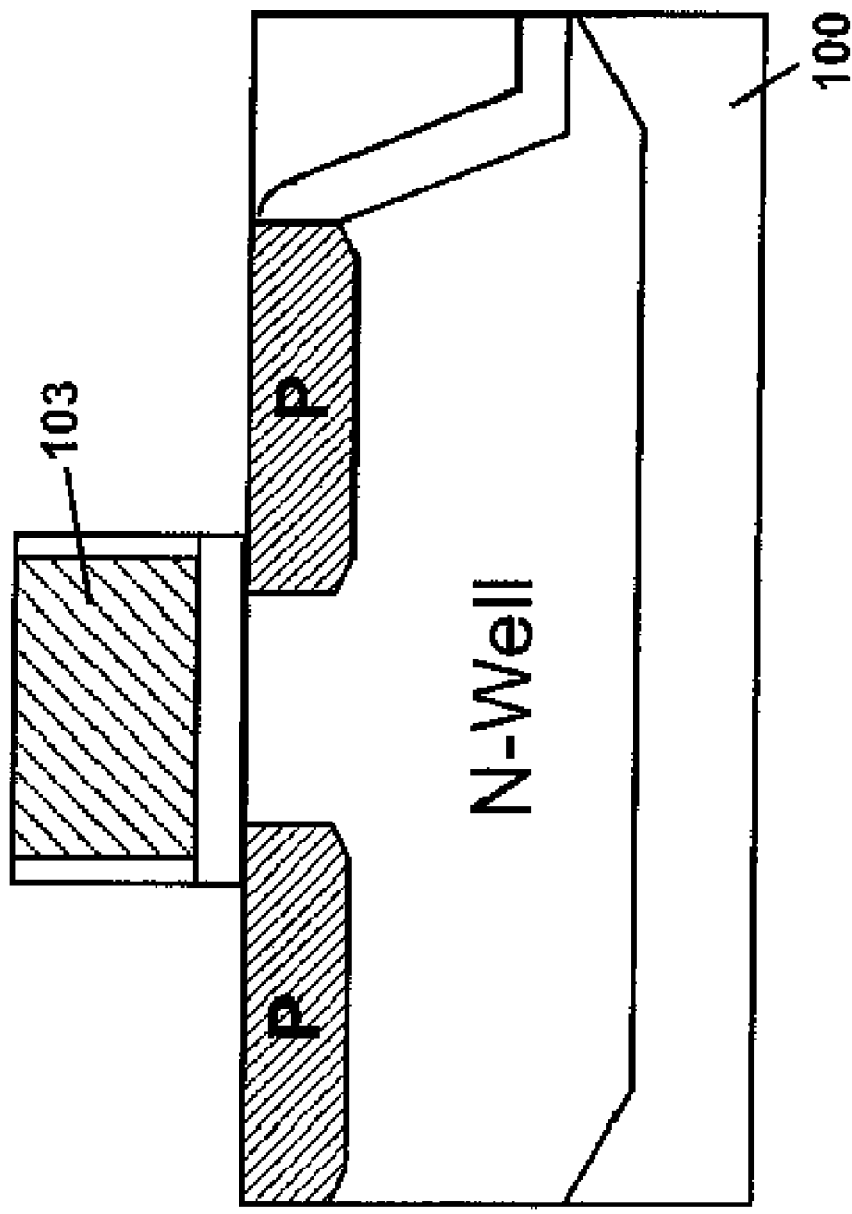
FIGS. 1 through 3 are simplified cross-sectional view diagrams illustrating a conventional method for fabricating a strained silicon MOS device.
Figure 2:
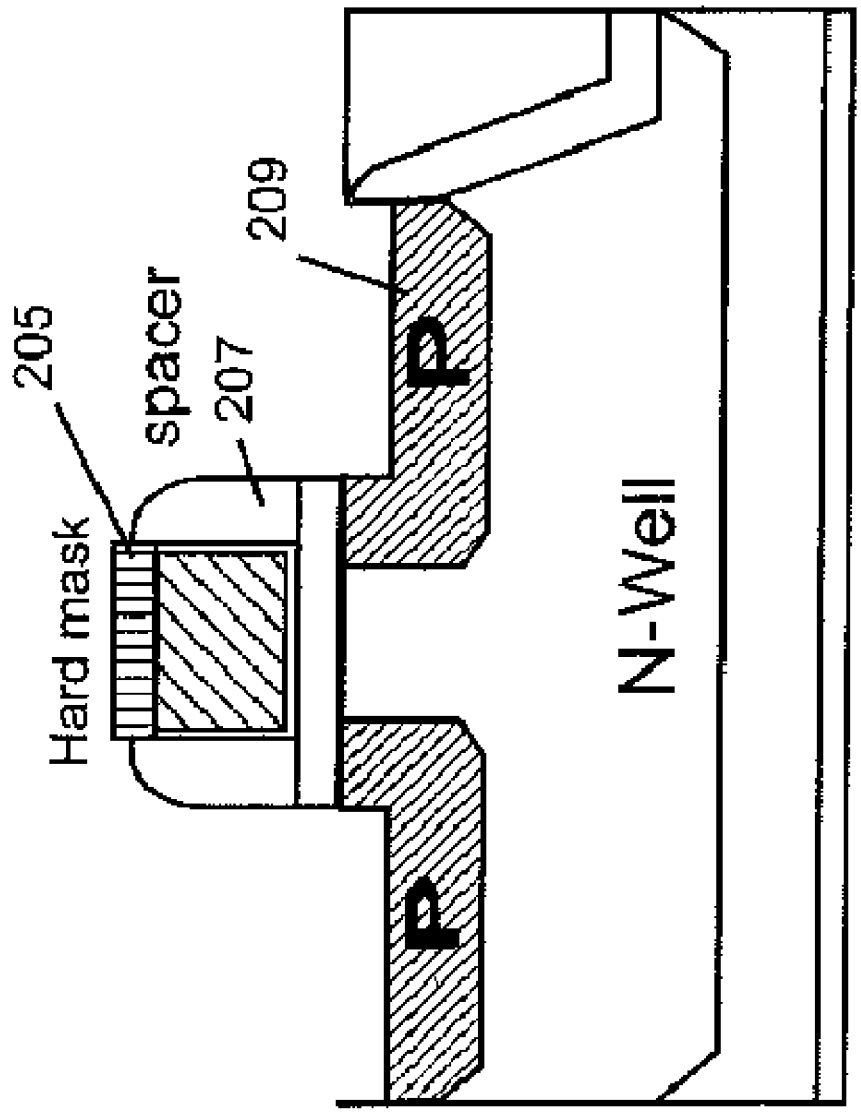
Figure 3:
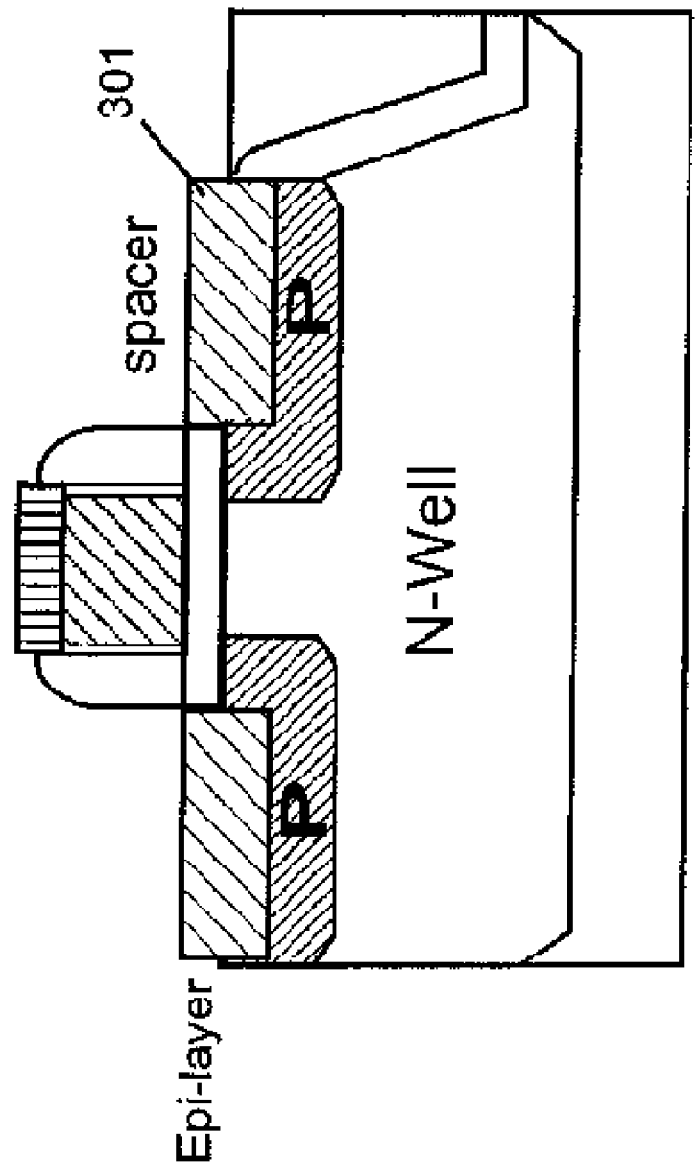

FIGS. 1 through 3 are simplified cross-sectional view diagram of conventional methods for fabricating a strained silicon MOS device. Referring to FIGS. 1 through 3, a conventional process sequence has been reproduced below.

1. Provide a silicon substrate (100);
2. Form gate layer (103);
3. Form dielectric hard mask (205);
4. Pattern dielectric mask;
5. Pattern gate layer to form polysilicon gates;
6. Deposit spacer layer and etch back to form spacer structures 207;
7. Etch source/drain recessed regions 209 in silicon;
8. Form epitaxial silicon/germanium 301 in recessed regions;
9. Remove hard mask; and
10. Perform other steps as desired.

As noted above, the MOS device is often made using the above process steps. As the device becomes more complex and line rules become smaller, it is more difficult to manufacture the strained silicon MOS devices for CMOS technologies. These and other limitations may be overcome by the present method and structures, which will be described in more detail below.

A method for fabricating an integrated circuit device according to an embodiment of the present invention may be outlined as follows:

1. Provide a semiconductor substrate (e.g., silicon, silicon on insulator, epitaxial silicon);
2. Form a first well region (e.g., N-type well) and a second well region, e.g., P-type well in the semiconductor substrate;
3. Form a dielectric layer (e.g., silicon dioxide, silicon nitride, silicon oxynitride) overlying the semiconductor substrate including the first well region and the second well region;
4. Form a polysilicon gate layer (e.g., doped polysilicon, insitu-doped polysilicon, amorphous silicon, which is crystallized) overlying the dielectric layer;
5. Form a hard mask (e.g., dielectric layer) overlying the polysilicon gate layer;
6. Pattern the polysilicon gate layer, including the hard mask layer, to form a first gate structure including first edges in the first well region and a second gate structure including second edges in the second well region;
7. Form a liner layer (e.g., TEOS) overlying the first gate structure and the second gate structure and overlying first source/drain regions in the first well region and second source/drain regions in the second well region;
8. Form a spacer dielectric layer overlying the liner layer;
9. Protect the second gate structure, including second source/drain regions, and a second portion of the spacer dielectric layer provided in the second well region using a second photoresist mask material;
10. Pattern the first portion of the spacer dielectric layer to form first sidewall spacer structures on the first gate structure, including the first edges while the second photomasking material protects the second portion of the spacer dielectric layer and the second gate structure, including the second source/drain regions in the second well region.
11. Etch a first source region and a first drain region adjacent to the first gate structure using a first portion of the hard mask layer and the first sidewall spacers as a protective layer;
12. Deposit a silicon germanium fill material into the first source region and the first drain region to fill the etched first source region and the etched first drain region while causing the first channel region between the first source region and the first drain region to be strained in compressive mode from at least the silicon germanium material formed in the first source region and the first drain region;
13. Remove the second photoresist masking material;
14. Form a blanket layer of silicon oxide overlying the first gate structure including the first source/drain regions in the first well region and the second gate structure including the second source/drain regions in the second well region;
15. Protect the first gate structure, including first source/drain regions, and a first portion of the spacer dielectric layer provided in the first well region using a first photoresist mask material;
16. Pattern the second portion of the spacer dielectric layer to form second sidewall spacer structures on the second gate structure, including the second edges while the first photomasking (used alternately for photoresist mask) material protects the first gate structure, including the first source/drain regions in the first well region;
17. Etch a second source region and a second drain region adjacent to the second gate structure using a second portion of the hard mask layer and the second sidewall spacers as a protective layer;
18. Deposit a silicon carbide fill material into the second source region and the second drain region to fill the etched second source region and the etched second drain region while causing the second channel region between the second source region and the second drain region to be strained in tensile mode from at least the silicon carbide material formed in the second source region and the second drain region;
19. Remove the first photoresist masking material;
20. Perform other steps, as desired.

The above sequence of steps provides a method according to an embodiment of the present invention. As shown, the method uses a combination of steps including a way of forming an integrated circuit device such as an MOS device for a CMOS integrated circuit. As shown, the method includes using a silicon rich oxide or silicon rich nitride or silicon oxide layer to facilitate the manufacture of both NMOS and PMOS devices in the CMOS integrated circuit device according to a specific embodiment. Other alternatives can also be provided where steps are added, one or more steps are removed, or one or more steps are provided in a different sequence without departing from the scope of the claims herein. Further details of the present method can be found throughout the present specification and more particularly below.

Figure 4:
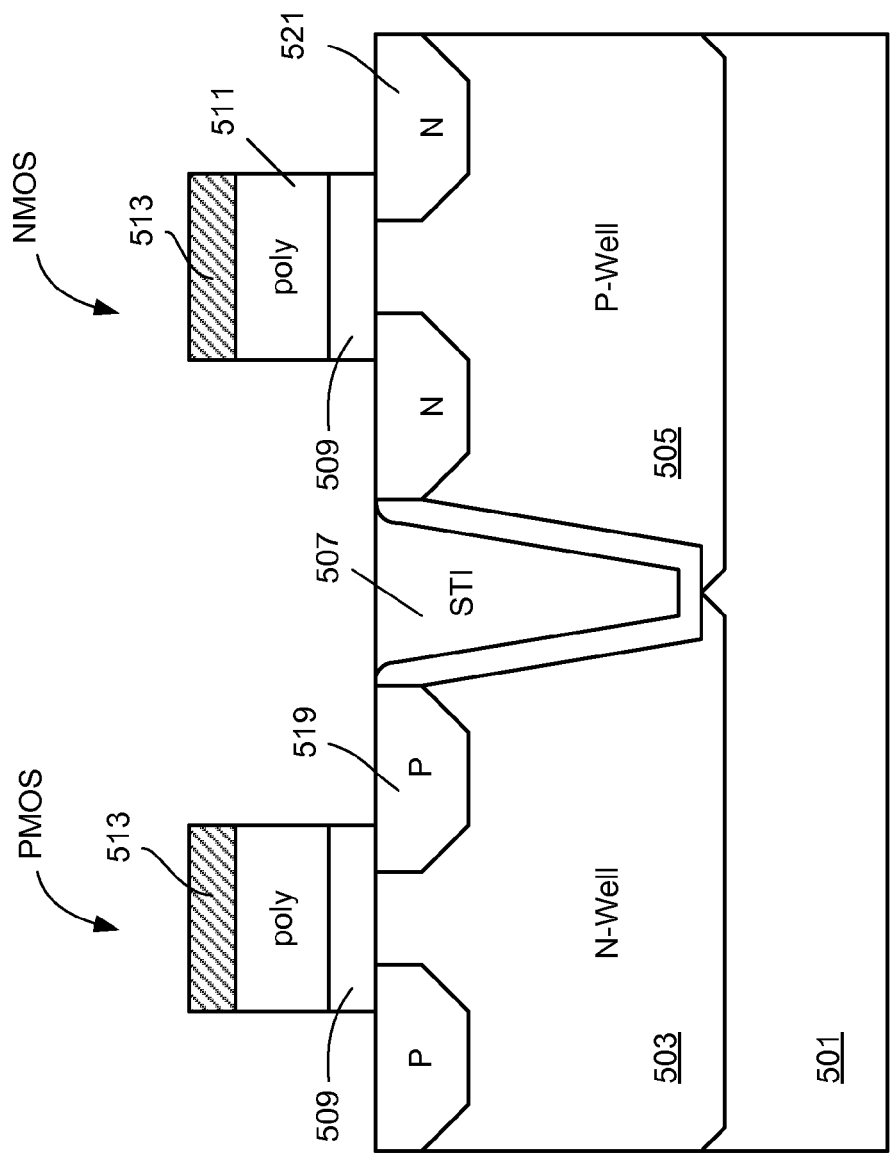
FIGS. 4 through 10 are simplified cross-sectional view diagrams illustrating a method for fabricating a strained silicon CMOS device according to an embodiment of the present invention.

FIGS. 4 through 10 are simplified cross-sectional view diagrams illustrating a method for fabricating a strained silicon CMOS device according to an embodiment of the present invention. These diagrams are merely examples, which should not unduly limit the scope of the claims herein. One of ordinary skill in the art would recognize many variations, alternatives, and modifications. As shown, the present method illustrates a semiconductor integrated circuit device, e.g., CMOS, including PMOS 510 and NMOS 520 device regions, as shown in FIG. 4. The method includes providing a semiconductor substrate 501, e.g., silicon, silicon on insulator, epitaxial silicon. The method includes forming a first well region 503 (e.g., N-type well) and a second well region 505, e.g., P-type well. Field isolation oxide regions, including shallow trench isolation oxide 507, is provided between active regions on the substrate. Of course, there can be other variations, modifications, and alternatives.

In a specific embodiment, the method includes forming a dielectric layer 509 (e.g., silicon dioxide, silicon nitride, silicon oxynitride) overlying the semiconductor substrate including the first well region and the second well region. The method forms a polysilicon gate layer 511 overlying the dielectric layer. In a preferred embodiment, the polysilicon gate layer is overlying a first channel region in the first well region and a second channel region in the second well region in the semiconductor substrate. The polysilicon can be made using a suitable technique including doped polysilicon, in-situ-doped polysilicon, and/or amorphous silicon, which is crystallized. Of course, there can be other variations, modifications, and alternatives.

In a specific embodiment, the method forms a hard mask 513 overlying the polysilicon gate layer, as also shown in FIG. 4. The hard mask is often made of a suitable material such as silicon dioxide, silicon nitride, oxide rich silicon oxynitride (provided by plasma enhanced CVD, for example) combinations of these, and others. The method patterns the polysilicon gate layer, including the hard mask layer, to form a first gate structure including first edges in the first well region and a second gate structure including second edges in the second well region. As shown, the first gate structure corresponds to the PMOS device region 510 and the second gate structure corresponds to the NMOS device region 520. The PMOS device region also includes lightly doped regions 519, which are often provided by implanting and/or other suitable techniques. The NMOS device region also includes lightly doped regions 521, which are often provided by implanting and/or other suitable techniques.

Figure 5:
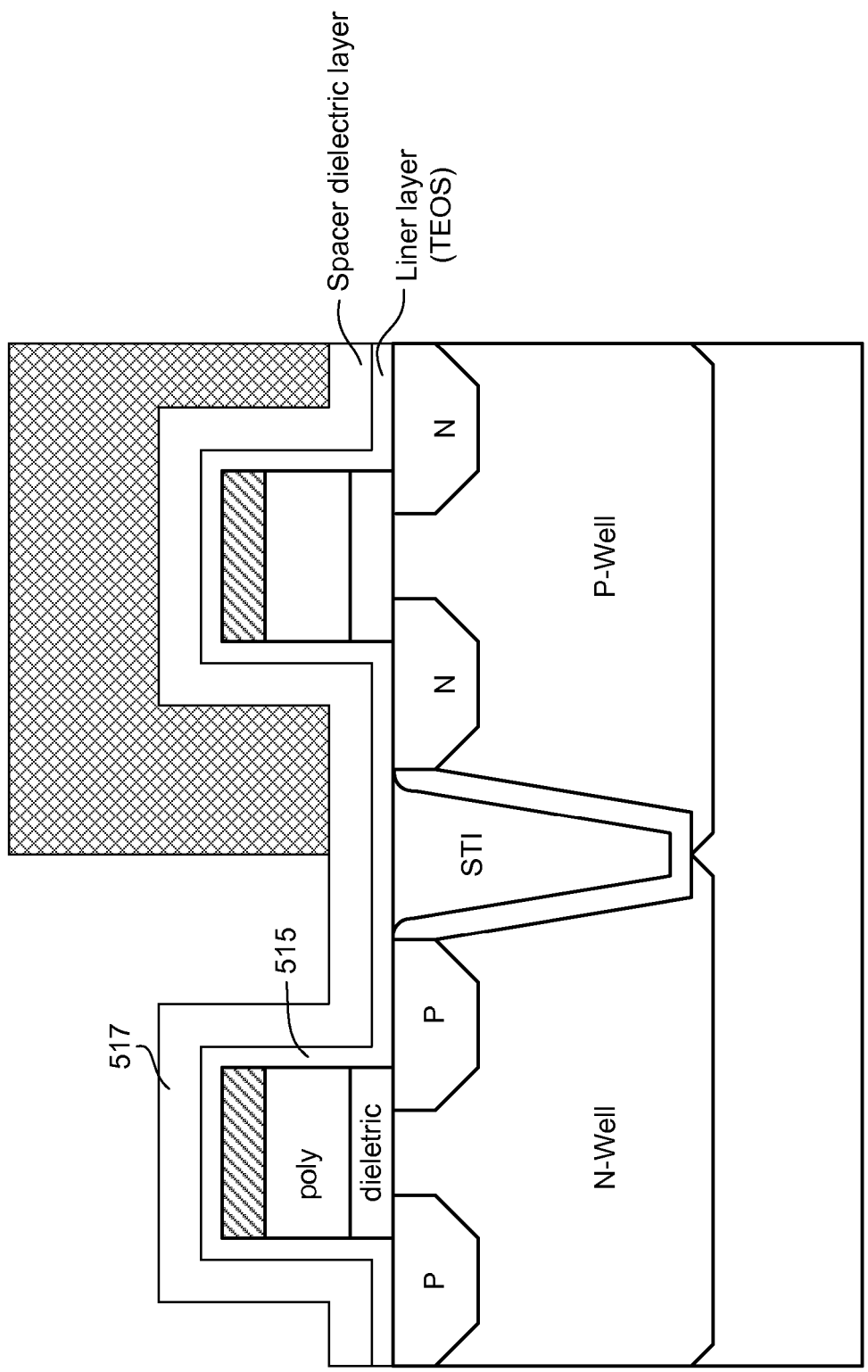

In a preferred embodiment, the method forms a liner layer 515 overlying the first gate structure and the second gate structure and overlying first source/drain regions in the first well region and second source/drain regions in the second well region, as shown in FIG. 5. In a preferred embodiment, the liner layer comprises a TEOS material and/or other suitable materials, depending upon the embodiment. In a preferred embodiment, the TEOS layer has a thickness of about 100 Angstroms or greater or 150 Angstroms or greater to be a suitable liner. The TEOS can be deposited using suitable techniques such as chemical vapor deposition, atmospheric chemical vapor deposition, and the like. Of course, the particular thickness will depending upon the specific embodiment, among other factors. In a preferred embodiment, the liner layer encloses an entirety of the surface region of the NMOS and PMOS devices regions, including source/drain regions, gate structures, isolation structures, and other exposed surface regions. Of course, there can be other variations, modifications, and alternatives.

Figure 6:
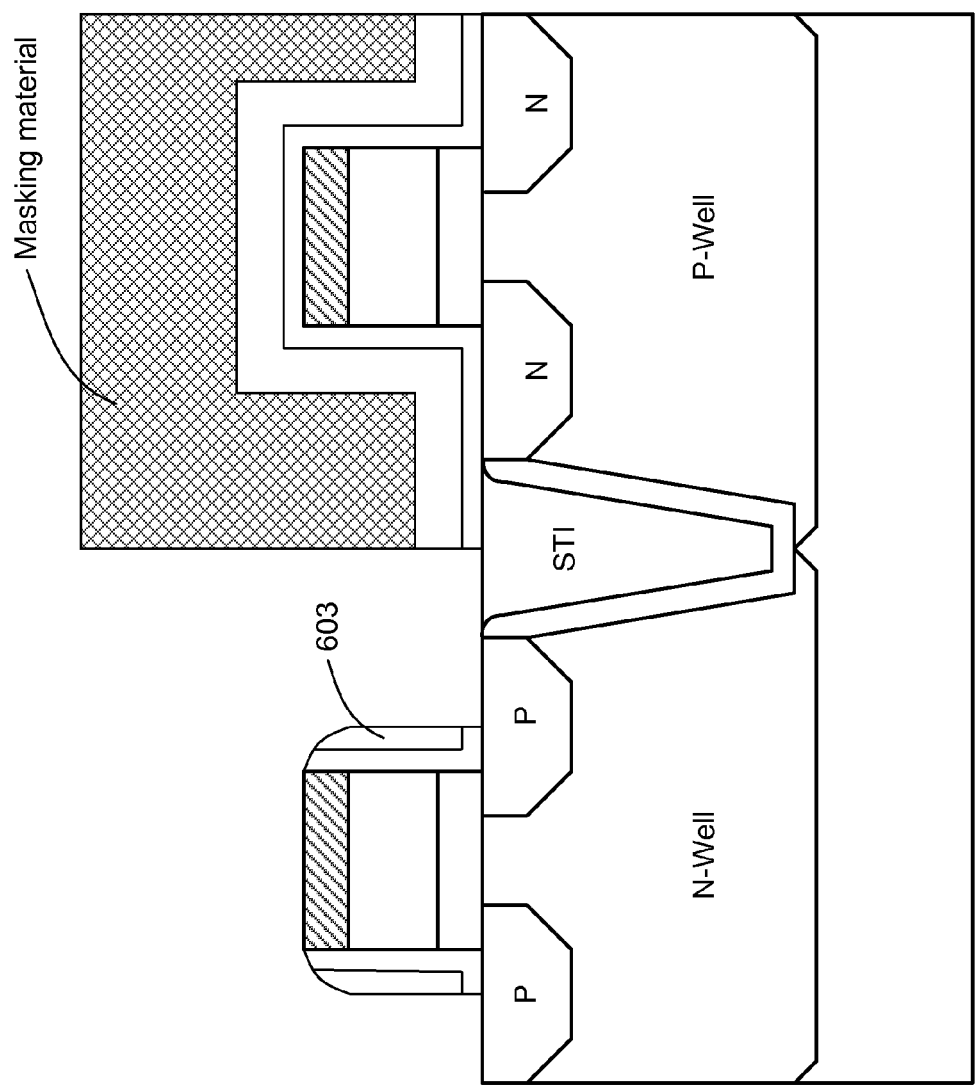

In a specific embodiment, the method forms a spacer dielectric layer 517 overlying the liner layer, also shown in FIG. 5. In a specific embodiment, the dielectric layer can be an oxide, a nitride, a silicon oxide/silicon nitride/silicon oxide combination, a silicon oxide/silicon nitride combination, or other suitable materials of sufficient thickness. The dielectric layer is also substantially pinhole free according to preferred embodiments. The dielectric layer is preferably less than 300 Angstroms in preferred embodiments. In a preferred embodiment, the method includes protecting the P-well region including the NMOS device structure using a photo masking layer. The photo masking layer can be any suitable material. In a specific embodiment, the method includes patterning the spacer dielectric layer to form first sidewall spacer structures 603 on the first gate structure, including the first edges according to a specific embodiment, as shown in FIG. 6. As shown, the masking material protects the NMOS device region including a portion of the shallow trench isolation, which separates the NMOS region from the PMOS region according to a specific embodiment. Of course, there can be other variations, modifications, and alternatives.

Referring again to FIG. 6, the method etches a first source region and a first drain region adjacent to the first gate structure using the hard mask layer and the first sidewall spacers as a protective layer. Etching occurs in the first source/drain regions, which are substantially silicon based, while other portions of dielectric material act as masking materials according to a specific embodiment. Etching occurs using a plasma etch process to form the recessed regions. Next, the method strips the masking layer overlying the second well region and exposes the second transistor structures in the second well region. Of course, there can be other variations, modifications, and alternatives.

Figure 7:
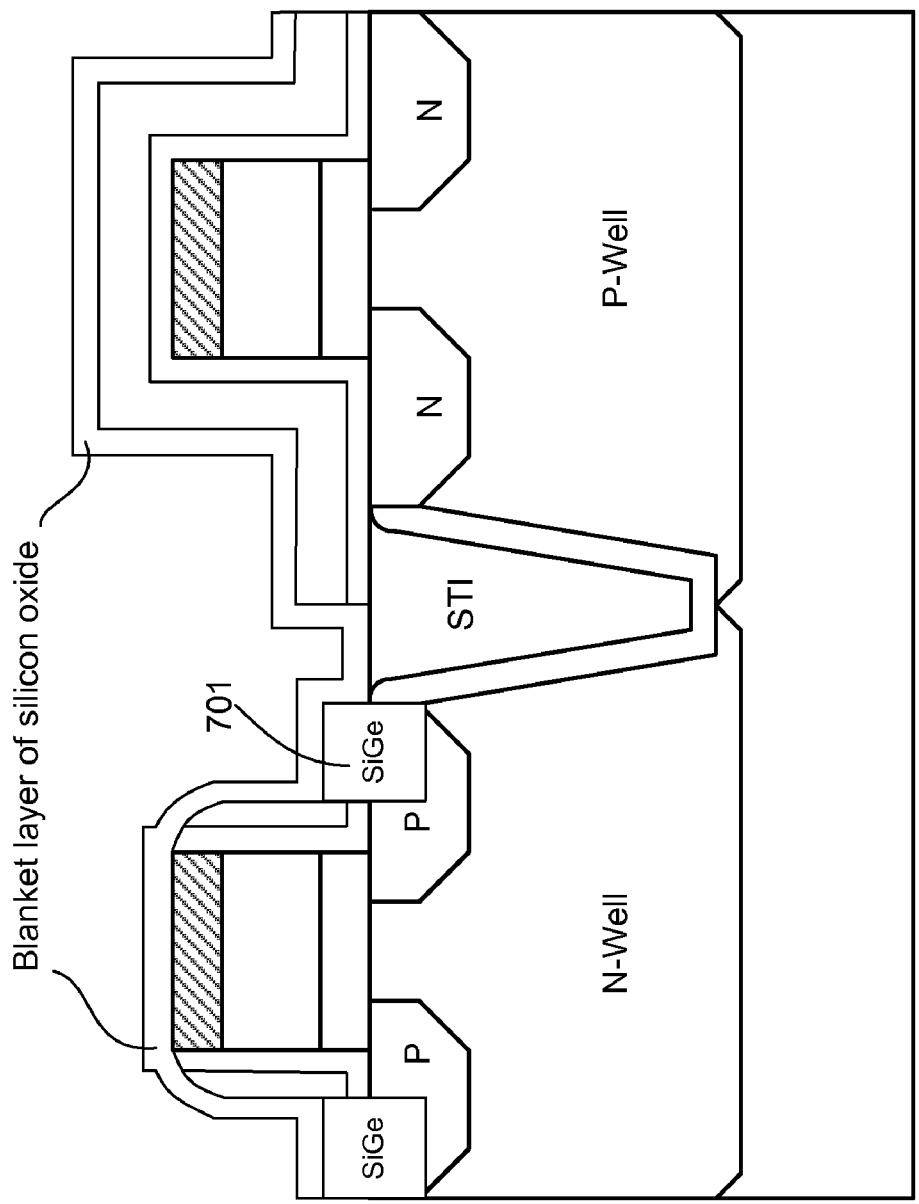

Referring to FIG. 7, the method selectively deposits a silicon germanium fill material 701 into the first source region and the first drain region to fill the etched first source region and the etched first drain region according to a specific embodiment. In a preferred embodiment, the deposition of silicon germanium fill material occurs while portions of the second well region remain free from silicon germanium. In a preferred embodiment, the silicon germanium fill material causes the first channel region between the first source region and the first drain region to be strained in compressive mode from at least the silicon germanium material formed in the first source region and the first drain region. Of course, there can be other variations, modifications, and alternatives.

In a preferred embodiment, the silicon germanium fill material is single crystalline and deposited using an epitaxial reactor. The ratio of silicon/germanium is 10% to 20% according to a specific embodiment. In a specific embodiment, the germanium is characterized by a concentration ranging from about 5 to about 45%, but can be others. The etched source region and the etched drain region are each coupled to the gate structure. As shown, the device has a strained channel region between the filled source region and the filled drain region from at least the silicon germanium material formed in the etched source region and the etched drain region. The device also has lightly doped drain regions or implant regions, which are formed before growing the silicon/germanium material in the recessed regions. Of course, there can be other variations, modifications, and alternatives.

In a specific embodiment, the method forms a blanket layer of silicon oxide overlying the first gate structure including the first source/drain regions in the first well region and the second gate structure including the second source/drain regions in the second well region, as illustrated in FIG. 7. In a specific embodiment, the blanket layer has a thickness of about 100 Angstrom to about 500 Angstroms.

Figure 8:
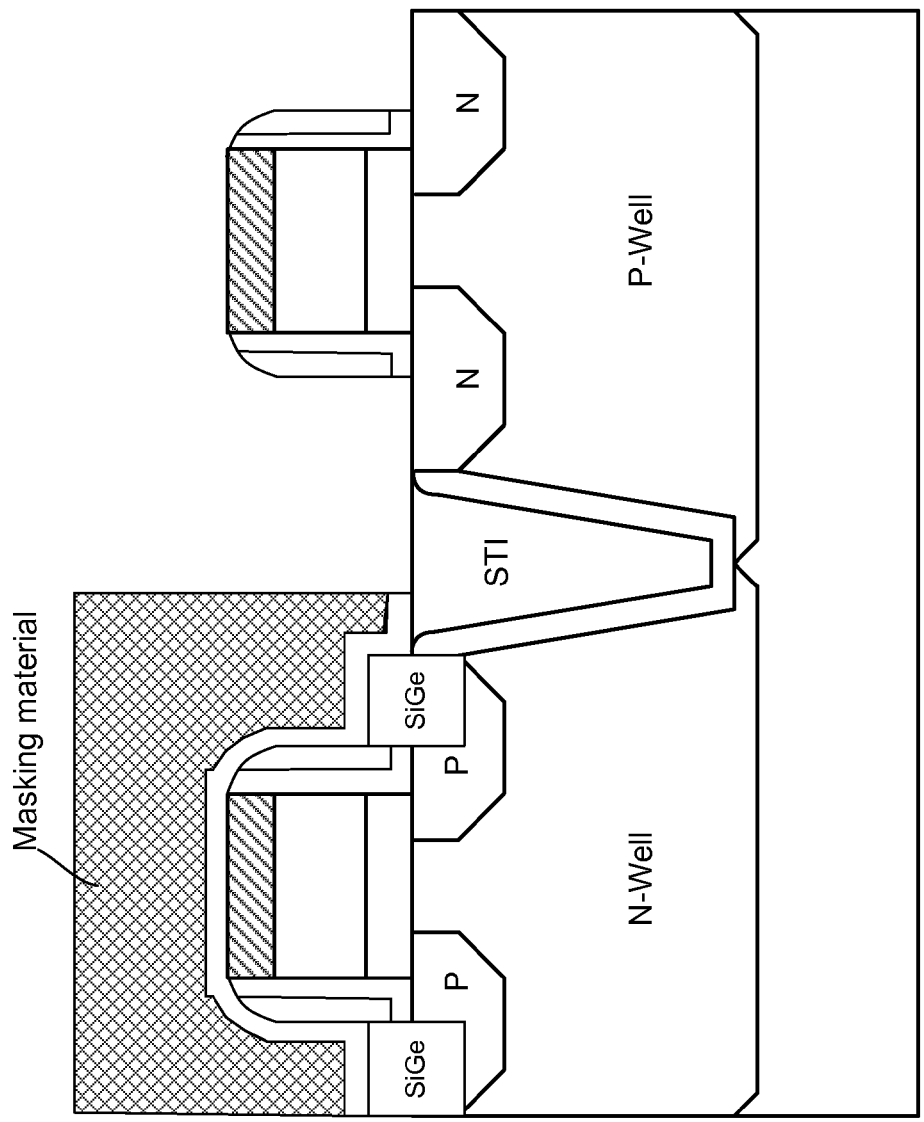

In a specific embodiment, the method protects the PMOS gate structure, including first source/drain regions, and the first portion of the spacer dielectric layer provided in the first well region using a first photoresist mask material, as shown in FIG. 8. The photo masking layer can be any suitable material. The method includes patterning the second portion of the spacer dielectric layer to form second sidewall spacer structures on the second gate structure, including the second edges while the first photomasking material protects the first gate structure, including the first source/drain regions in the first well region. Of course, there can be other variations, modifications, and alternatives.

In a specific embodiment, the method includes etching a second source region and a second drain region adjacent to the second gate structure using a second portion of the hard mask layer and the second sidewall spacers as a protective layer. Etching occurs in the second source/drain regions, which are substantially silicon based, while other portions of dielectric material act as masking materials according to a specific embodiment. Etching occurs using a plasma etch process to form the recessed regions. Next, the method strips the masking layer overlying the second well region and exposes the second transistor structures in the second well region.

Figure 9:
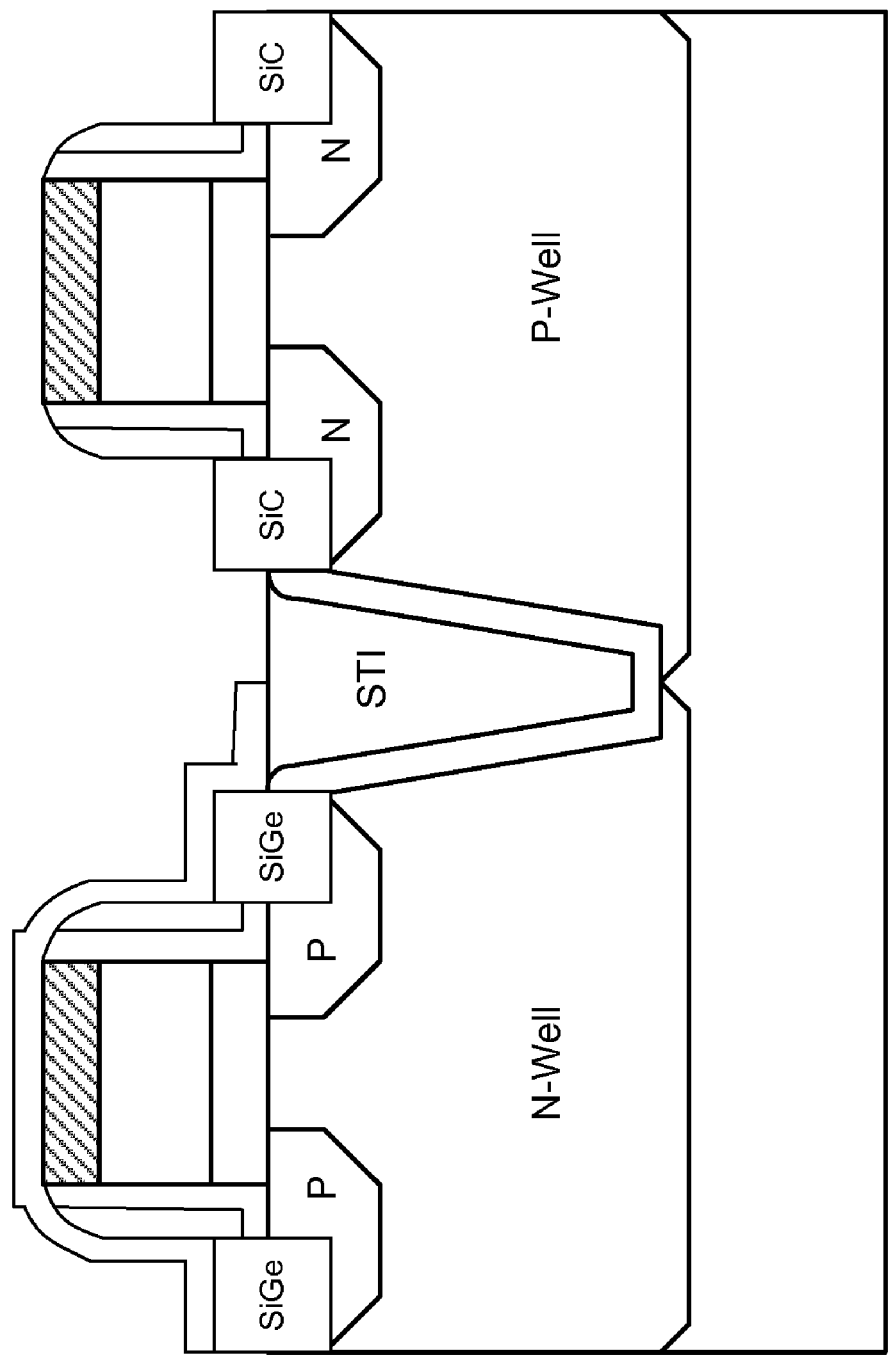
Figure 10:
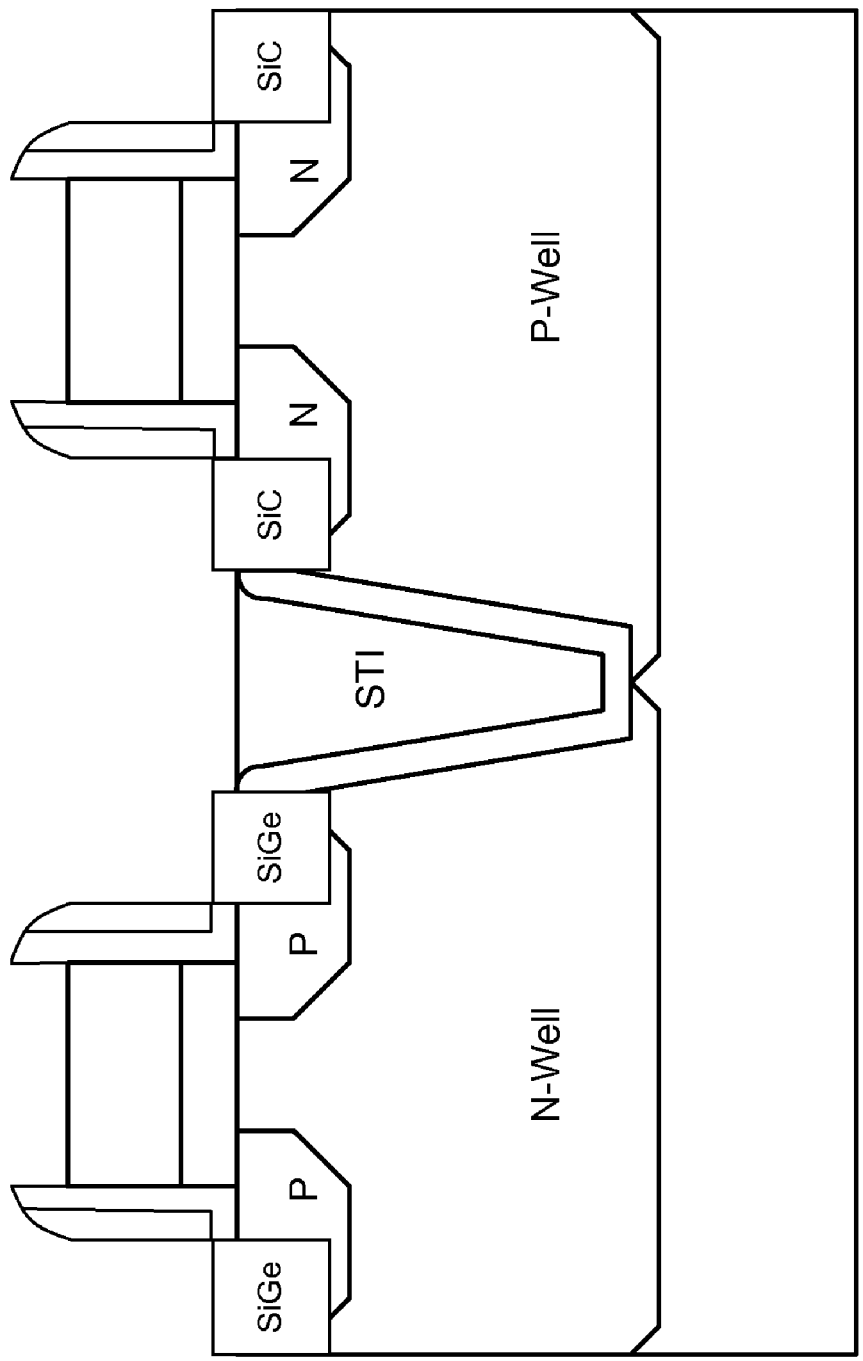

In a specific embodiment, the method then deposits a silicon carbide fill material into the second source region and the second drain region to fill the etched second source region and the etched second drain region, as illustrated by FIG. 9. The silicon carbide is deposited using an epitaxial growth process, which is essentially single crystal according to a specific embodiment. The silicon carbide has a smaller lattice constant than silicon crystal structures, which leads to cause the second channel region between the second source region and the second drain region to be strained in tensile mode from at least the silicon carbide material formed in the second source region and the second drain region. The first photoresist masking material is removed, as shown. In a specific embodiment, concurrent with the blanket layer of silicon oxide, the method strips the hard mask material, which can be selectively removed from the polysilicon gate structures, as illustrated by FIG. 10. Depending upon the embodiment, a silicided material (e.g., titanium, tungsten, cobalt, nickel, platinum, and others) can be provided overlying the polysilicon gate structure, as well as other active portions, e.g., source/drain regions, of the PMOS and NMOS device structures. Of course, there can be other variations, modifications, and alternatives.

In a specific embodiment, the method includes a photolithography and etching process that forms one or more regions that do not include silicide formation blocked by a dielectric layer, while removing the bulk part of the film at other regions. The etching process is preferably anisotropic reactive ion etching (RIE) that remove more material on a horizontal surface than on vertical surface regions. As a result, the exposed spacer is covered by a thin oxide layer. Of course, there can be other variations, modifications, and alternatives.

In a specific embodiment, the photoresist is then stripped by ashing, for example. In a preferred embodiment, the substrate is then dipped in a phosphoric acid solution, which selectively removes the silicon rich nitride or silicon oxide or silicon rich oxide and also strips the polysilicon hard mask. In a preferred embodiment, the substrate is further cleaned by a diluted hydrofluoric acid, commonly termed HF, to remove any remaining oxide on the surface regions after removal of the hard mask layer. The method deposits metals including titanium, cobalt, nickel, platinum, and tungsten, for example, using a silicidation process. Other metals can also be used. As has been illustrated, the present method includes a combination of a spacer protection layer that prevents nitride spacer erosion during the gate polysilicon hardmask removal with salicide block into a single process according to a specific embodiment. Hence, the present method can reduce certain steps such as oxide deposition, etch back wet clean, and others associated with both of these processes. Of course, there can be other variations, modifications, and alternatives.

In a specific embodiment, further details of the present method and structures can be found throughout the present specification and more particularly below. In a specific embodiment, the hard mask used for poly gate patterning can be a silicon oxide or oxide rich SiON formed by PECVD, or other suitable techniques. In a specific embodiment, the spacer used can be a silicon oxide liner with thickness of 10 Angstroms (Å) to 200 Ansgtroms followed by a SiN with thickness of 50 Å to 900 Å, as well as other dimensions. FIG. 6 shows the cross-section that PMOS regions had spacer etch forming PMOS spacers, while the NMOS regions are protected by photo resist. In a specific embodiment, the silicon substrate etch of source/drain regions is self-aligned on the PMOS region using poly hard mask and spacer as a patterning mask. After that, SiGe is then epitaxially grown on the recessed silicon substrate. In a specific embodiment, the germanium concentration ranges from 5-45%, but can be others. In a specific embodiment, the liner oxide can have a thickness ranging from about 50 Å to 500 Å and consists of silicon dioxide made of chemical vapor deposition. In one or more embodiments, the silicon carbide in the epi layer ranges from 0.5 to 10%, but can be others. As provided herein, the CMOS epi strain layers are now selectively formed one after another. As noted, the poly hard mask and the oxide layer on top of PMOS region are then stripped simultaneously by using diluted HF. Depending upon the embodiment, steps can be exchanged, steps can be added, or even removed. In a specific embodiment, formation of the PMOS and NMOS devices can be exchanged without departing from the scope of the claims herein. That is, the NMOS can be formed before the PMOS devices according to a specific embodiment. Of course, there can be other variations, modifications, and alternatives.

In a specific embodiment, a $SiN_x$ film with high tensile stress is then deposited on the structures by plasma enhanced chemical vapor deposition (PECVD), for example, or other suitable technique. The silicon nitride film thickness ranges from about 200 Angstroms to 1200 Angstroms and is provided overlying the NMOS devices to cause additional strain in a tensile mode in the NMOS channel region. Of course, there can be other variations, modifications, and alternatives.

In a specific embodiment, the method also includes forming an interlayer dielectric material overlying the entirety of the PMOS and NMOS device structures. In a preferred embodiment, the interlayer dielectric, such as boro-phosphate-silicate-glass (BPSG), boro-silicate glass (BSG), phosphosilicate glass (PSG) or high density plasma (HDP) film is then deposited followed by PECVD oxide layer. Depending upon the specific embodiment, the interlayer dielectric can be a single material, a combination of layers, and the like. The method also includes contact pattern and formation performed to complete the PMOS and NMOS integration on strained silicon. Of course, there can be other variations, modifications, and alternatives.

Although the above has been described in terms of an MOS device, there can be other variations, modifications, and alternatives. It is also understood that the examples and embodiments described herein are for illustrative purposes only and that various modifications or changes in light thereof will be suggested to persons skilled in the art and are to be included within the spirit and purview of this application and scope of the appended claims.

What is claimed is:
1. A method for forming a semiconductor integrated circuit device comprising:
   providing a semiconductor substrate including a first well region and a second well region;
   forming a dielectric layer overlying the semiconductor substrate including the first well region and the second well region;
   forming a polysilicon gate layer overlying the dielectric layer, the polysilicon gate layer being overlying a first channel region in the first well region and a second channel region in the second well region in the semiconductor substrate;
   forming a hard mask overlying the polysilicon gate layer;
   patterning the polysilicon gate layer, including the hard mask layer, to form a first gate structure including first edges in the first well region and a second gate structure including second edges in the second well region;

forming a liner layer overlying the first gate structure and the second gate structure and overlying a first source region and a first drain region in the first well region and a second source region and a second drain region in the second well region;

forming a spacer dielectric layer overlying the liner layer, the spacer dielectric layer including a first portion overlying the first gate structure and a second portion overlying the second gate structure;

protecting the second gate structure, including the second source and drain regions, and the second portion of the spacer dielectric layer provided in the second well region using a second photoresist mask material;

patterning the first portion of the spacer dielectric layer to form first sidewall spacer structures on the first gate structure, including the first edges while the second photoresist mask material protects the second portion of the spacer dielectric layer and the second gate structure, including the second source and drain regions in the second well region;

etching a first source region and a first drain region adjacent to the first gate structure using the hard mask layer and the first sidewall spacers as a protective layer;

depositing a silicon germanium fill material into the first source region and the first drain region to fill the etched first source region and the etched first drain region while causing the first channel region between the first source region and the first drain region to be strained in compressive mode from at least the silicon germanium material formed in the first source region and the first drain region;

removing the second photoresist masking material;

protecting the first gate structure, including first source/drain regions, and the first portion of the spacer dielectric layer provided in the first well region using a first photoresist mask material;

patterning the second portion of the spacer dielectric layer to form second sidewall spacer structures on the second gate structure, including the second edges while the first photoresist mask material protects the first gate structure, including the first source/drain regions in the first well region;

etching a second source region and a second drain region adjacent to the second gate structure using the hard mask layer and the second sidewall spacers as a protective layer;

depositing a silicon carbide fill material into the second source region and the second drain region to fill the etched second source region and the etched second drain region while causing the second channel region between the second source region and the second drain region to be strained in tensile mode from at least the silicon carbide material formed in the second source region and the second drain region; and removing the first photoresist masking material.

2. The method of claim 1 wherein the dielectric layer is less than 300 Angstroms.

3. The method of claim 1 wherein the semiconductor substrate comprises essential silicon material.

4. The method of claim 1 wherein the silicon germanium material is single crystalline.

5. The method of claim 1 wherein the silicon germanium has a ratio of silicon/germanium of 10% to 20%.

6. The method of claim 1 wherein the selectively removing comprises a wet etch including a hydrogen fluoride species.

7. The method of claim 1 wherein the hard mask is a thickness of about 200 to about 400 Angstroms.

8. The method of claim 1 wherein the depositing is provided using an epitaxial reactor.

9. The method of claim 1 wherein the compressive mode increases a mobility of holes in the first channel region.

10. The method of claim 1 wherein the hard mask comprises a silicon dioxide, a silicon rich oxide, or oxide rich silicon oxynitride.

11. The method of claim 1 wherein the spacer dielectric layer comprises an oxide bearing material.

12. The method of claim 1 wherein the spacer dielectric layer comprises an oxide on nitride on oxide material.

13. The method of claim 1 wherein the spacer dielectric layer comprises an oxide on nitride material.

14. The method of claim 1 wherein the blanket layer of silicon oxide has a thickness of about 100 Angstroms to about 500 Angstroms.

15. The method of claim 1 wherein the liner layer comprises a TEOS material having a thickness of greater than 100 Angstroms.

* * * * *